(12) United States Patent
Maeda et al.

(10) Patent No.: US 6,459,125 B2
(45) Date of Patent: *Oct. 1, 2002

(54) SOI BASED TRANSISTOR INSIDE AN INSULATION LAYER WITH CONDUCTIVE BUMP ON THE INSULATION LAYER

(75) Inventors: Shigenobu Maeda, Tokyo (JP); Tadashi Nishimura, Tokyo (JP); Kazuhito Tsutsumi, Tokyo (JP); Shigeto Maegawa, Tokyo (JP); Yuuichi Hirano, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,863

(22) Filed: Jul. 27, 1998

(30) Foreign Application Priority Data

Feb. 26, 1998 (JP) .......................................... 10-045459

(51) Int. Cl.$^7$ .............................................. H01L 29/00
(52) U.S. Cl. ........................ 257/347; 257/348; 257/349; 257/350; 257/351; 257/352; 257/353; 257/354; 257/355; 257/737; 257/738
(58) Field of Search .................... 257/59, 72, 347–355, 257/737, 738; 349/110, 111

(56) References Cited

U.S. PATENT DOCUMENTS

| | | | |
|---|---|---|---|
| 5,024,965 A | | 6/1991 | Chang et al. |
| 5,488,243 A | * | 1/1996 | Tsuruta et al. ............... 257/314 |
| 5,499,123 A | * | 3/1996 | Mikoshiba ................... 349/110 |
| 5,633,524 A | | 5/1997 | Ueda et al. |
| 5,757,050 A | * | 5/1998 | Adler et al. ................. 257/347 |

FOREIGN PATENT DOCUMENTS

| | | |
|---|---|---|
| JP | 63-110734 | 5/1988 |
| JP | 63-229726 | 9/1988 |
| JP | 63-262867 | 10/1988 |
| JP | 3-272176 | 12/1991 |
| JP | 6-244239 | 9/1994 |
| JP | 8-139296 | 5/1996 |
| JP | 8-274243 | 10/1996 |
| WO | WO 94/17553 | 8/1994 |

OTHER PUBLICATIONS

Patent Abstracts of Japan, vol. 1999, No. 02, Feb. 26, 1999, JP 10–294318, Nov. 4, 1998.

B.R. Aimi, IBM Technical Disclosure Bulletin, vol. 23, No. 5, pp. 1833–1834, "Multi–Chip Carrier", Oct. 1, 1980.

* cited by examiner

Primary Examiner—Fetsum Abraham
(74) Attorney, Agent, or Firm—Oblon, Spivak, McClelland, Maier & Neustadt, P.C.

(57) ABSTRACT

A semiconductor device for CSP mounting which avoids errors due to alpha rays and is highly stress-resistant is provided. A buried oxide film (107) is formed on a semiconductor substrate (101), and a MOS transistor having an SOI structure is formed on the buried oxide film (107). The MOS transistor comprises source and drain regions (120a, 120b) formed in a semiconductor layer (120), and a gate electrode (110). An aluminum pad (103) connected to any one of the source and drain regions (120a, 120b) through a connecting mechanism not shown, and a silicon nitride film (104) having an opening on the top of the aluminum pad (103) are formed on an interlayer insulation film (108). A layer of titanium (105) and a layer of nickel (106) are formed extending from the aluminum pad (103) to an end of the silicon nitride film (104). A solder bump (11) is disposed on the layer of nickel (106).

24 Claims, 7 Drawing Sheets

US 6,459,125 B2

SOI BASED TRANSISTOR INSIDE AN INSULATION LAYER WITH CONDUCTIVE BUMP ON THE INSULATION LAYER

BACKGROUND OF THE INVENTION

1. Field of the Invention

The present invention relates to a semiconductor device and, more particularly, to a semiconductor device packaged in CSP (Chip Size Package) form.

2. Description of the Background Art

FIG. 9 is a schematic cross-sectional view showing conventional CSP mounting. A semiconductor device 1 is directly mounted in the form of a chip on a printed board 2 for the purpose of reducing the area required to mount the semiconductor device 1 on the printed board 2. The semiconductor device 1 in chip form comprises solder bumps 11 through which the semiconductor device 1 is connected to the printed board 2.

FIG. 10 is a schematic cross-sectional view showing another type of conventional CSP mounting. As shown in FIG. 10, the semiconductor device 1 in chip form is, in some cases, covered with a molding resin 12 which allows the solder bumps 11 to be exposed.

FIGS. 11 through 14 are cross-sectional views showing a method of fabricating a conventional semiconductor device in the order of sequential process steps. Referring to FIG. 11, diffusion layers 101a and 101b functioning as a source and a drain are formed in an upper surface of a semiconductor substrate 101 of silicon, for example. An interlayer insulation film 102 made of, for example, silicon oxide is formed on the semiconductor substrate 101. With a gate insulating film (equated with the interlayer insulation film 102 for purposes of simplification of illustration) therebetween, a gate 109 is opposed to the upper surface of a portion of the semiconductor substrate 101 which lies between the diffusion layers 101a and 101b. An aluminum pad 103 is connected to the diffusion layer 101b through a connecting mechanism not shown, for example, a contact hole.

A silicon nitride film 104 is formed on the structure shown in FIG. 11 by the plasma CVD process. Part of the silicon nitride film 104 which overlies the aluminum pad 103 is selectively removed by the photolithography and etching to provide the structure shown in FIG. 12.

A layer of titanium 105 and a layer of nickel 106 are deposited on the structure shown in FIG. 12 by the sputtering process. The photolithography and etching processes are performed so that the layer of titanium 105 and the layer of nickel 106 are left only in an area extending from the aluminum pad 103 to an end of the silicon nitride film 104, thereby to provide the structure shown in FIG. 13.

A solder bump 11 is disposed on a multilayer structure consisting of the aluminum pad 103, the layer of titanium 105, and the layer of nickel 106 in the structure shown in FIG. 13 to provide the structure shown in FIG. 14.

It is well known in the art that, when irradiated with an alpha ray 91, electrons 93 and holes 92 generated in semiconductor cause operation errors of a semiconductor device. Although the molding resin 12 covers the semiconductor device with the solder bumps 11 exposed as shown in FIG. 10, there has been a need to use a polyimide resin, for example, which is less pervious to alpha rays than the material of the typical molding resin 12 to shield and protect the semiconductor device against the alpha rays.

Unfortunately, it has been difficult for the polyimide resin to shield and protect the semiconductor device in chip form used in the conventional CSP mounting against the alpha rays. The production of a polyimide in place of or on the silicon nitride film 104 might result in the removal of the layer of titanium 105 and the layer of nickel 106 and the generation of the uneven or rough surfaces thereof.

These problems result from a film-deposition temperature exceeding 300° C. at which the layer of titanium 105 and the layer of nickel 106 are deposited by the sputtering process. In general, a polyimide is produced by dehydrating carboxylic polyamide in a liquid state by heating at a temperature of 300° C. to 350° C. to cause polymerization to occur. However, it is difficult to completely remove moisture contained in the carboxylic polyamide. The moisture remaining in the polyimide might be released during the sputtering of the layer of titanium 105 and the layer of nickel 106 to result in the problems of the removal thereof and the generation of the uneven surfaces thereof.

Further, stresses are applied between the semiconductor chip and the printed board since the printed board generally has greater thermal expansion properties than the semiconductor chip. In the CSP mounting, there are no stress-relieved lead frames in lead frame type packaging, resulting in difficulties in relieving stresses after packaging. The difficulties in the stress relief present the likelihood of cracks generated in the semiconductor substrate 101. The diffusion layers 101a and 101b are generally formed in an impurity diffusion region known as a well. The generation of cracks in the well significantly degrades transistor characteristics.

SUMMARY OF THE INVENTION

According to a first aspect of the present invention, a semiconductor device comprises: a semiconductor layer provided in an insulating layer and including a transistor having an SOI structure formed therein; an electrode provided on the insulating layer; and an electrically conductive bump provided on the electrode.

Preferably, according to a second aspect of the present invention, in the semiconductor device of the first aspect, the transistor includes a plurality of transistors field-shield isolated from each other and formed in the semiconductor layer.

A third aspect of the present invention is also intended for a method of fabricating a semiconductor device. According to the present invention, the method comprises the steps of: (a) forming an electrode on a semiconductor substrate; and (b) forming an electrically conductive bump on the electrode and forming an insulating film for blocking an alpha ray and covering an upper surface of the semiconductor substrate except the electrode.

Preferably, according to a fourth aspect of the present invention, in the method of the third aspect, the step (b) comprises the steps of (b-1) forming the insulating film for blocking the alpha ray and covering the upper surface of the semiconductor substrate so that at least part of the electrode is exposed, and (b-2) forming the electrically conductive bump on the exposed part of the electrode.

Preferably, according to a fifth aspect of the present invention, in the method of the third aspect, the step (b) comprises the steps of (b-1) forming the bump on the electrode, and (b-2) dropping the material of the insulating film for blocking the alpha ray onto the upper surface of the semiconductor substrate except onto the electrode.

According to a sixth aspect of the present invention, a semiconductor device comprises: a semiconductor substrate; an electrode disposed on the semiconductor substrate; an electrically conductive bump provided on the electrode; a film covering the semiconductor substrate except the bump and for blocking an alpha ray; a first element disposed in the semiconductor substrate in an area that is visible from the bump without being obstructed by the film; and a second element disposed in the semiconductor substrate in other than the area, the second element being less resistant to the alpha ray than the first element.

Preferably, according to a seventh aspect of the present invention, in the semiconductor device of the sixth aspect, the first element is a MOS transistor having a body at a fixed potential.

The semiconductor device of the first and second aspects of the present invention may perform the so-called CSP mounting wherein the conductive bump is connected to a printed board. Additionally, the transistor has the SOI structure, and electrons and holes generated due to an alpha ray in the semiconductor layer in which the transistor is formed are in amounts which do not influence the operation of the transistor. Further, there is a low likelihood of cracks generated in the semiconductor layer because of stresses resulting from the difference in thermal expansion coefficient between the printed board and the semiconductor device which have been a problem in the CSP mounting.

In accordance with the method of the third to fifth aspects of the present invention, if the alpha ray blocking film made of a polyimide which is not resistant to heating after being formed is used as the insulating film, influences of the increase in temperature during the formation of the electrode upon the insulating film are avoided since the formation of the electrode underlying the bump precedes the formation of the insulating film.

In accordance with the semiconductor device of the sixth aspect of the present invention, the first element which is highly resistant to an alpha ray is formed in the area wherein no film blocks the alpha ray coming from the bump. This allows effective area use and avoids adverse effects resulting from the alpha ray.

In accordance with the semiconductor device of the seventh aspect of the present invention, the body of the MOS transistor serving as the first element is at the fixed potential. This suppresses parasitic bipolar effects to further increase the resistance to the alpha ray.

It is therefore an object of the present invention to provide a semiconductor device for CSP mounting which avoids errors resulting from an alpha ray or which is highly resistant to stresses.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
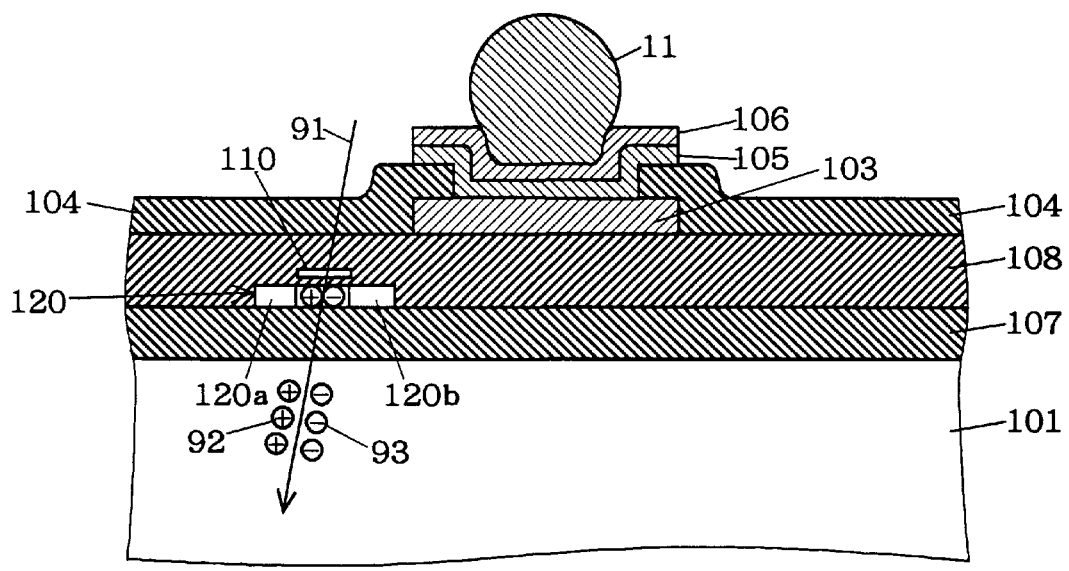
FIG. 1 is a cross-sectional view illustrating a structure of a semiconductor device according to a first preferred embodiment of the present invention.

FIG. 1 is a cross-sectional view illustrating a structure of a semiconductor device according to a first preferred embodiment of the present invention. A buried oxide film 107 is formed on a semiconductor substrate 101 of silicon, for example. A MOS transistor having an SOI (Semiconductor On Insulator) structure is formed on the buried oxide film 107. The MOS transistor comprises source and drain regions 120*a* and 120*b* formed in a semiconductor layer 120 of silicon, for example, and a gate electrode 110. The semiconductor layer 120 and the gate electrode 110 are covered with an interlayer insulation film 108 made of, for example, BPTEOS (Boro Phospho Tetra Ethyl Ortho Silicate) and NSG (Non-doped Silicate Glass) and formed on the buried oxide film 107.

An aluminum pad 103 connected to any one of the source and drain a regions 120*a* and 120*b* through a connecting mechanism not shown, and a silicon nitride film 104 having an opening on the top of the aluminum pad 103 are formed on the interlayer insulation film 108. A layer of titanium 105 and a layer of nickel 106 are formed only in an area extending from the aluminum pad 103 to an end of the silicon nitride film 104. A solder bump 11 is disposed on the layer of nickel 106.

A lower part (including the semiconductor substrate 101) of such a structure which lies below and includes the interlayer insulation film 108 may be provided using the technique of forming a conventional SOI transistor. An upper part (including the solder bump 11) of such a structure which lies above the interlayer insulation film 108 may be formed by the conventional technique shown in FIGS. 11 through 14.

Electrons 93 and holes 92 are generated in the semiconductor layer 120 and the semiconductor substrate 101 when the structure of FIG. 1 is irradiated with an alpha ray 91. However, since the semiconductor layer 120 is provided for the SOI transistor, the thickness of the semiconductor layer 120 may be reduced to a thickness level required for channel formation. Thus, the electrons 93 and holes 92 generated in the semiconductor layer 120 are much smaller in number than those generated in the semiconductor substrate 101. For this reason, the SOI transistor is less affected adversely by the alpha ray 91 than a so-called bulk transistor such as that shown in FIG. 14.

Additionally, when such a structure is cooled after the heating of the solder bump 11 and the CSP mounting, stresses are produced so that the printed board having a higher thermal expansion coefficient than the semiconductor chip shrinks by a greater amount. However, since the semiconductor layer 120 is thin in thickness and short in length, the probability of cracks generated in the semiconductor layer 120 is lower than those generated in the semiconductor substrate 101. This achieves a semiconductor chip has greater resistance to stresses than the structure shown in FIG. 14 without impairing size reduction which is characteristic of CSP.

Figure 2:
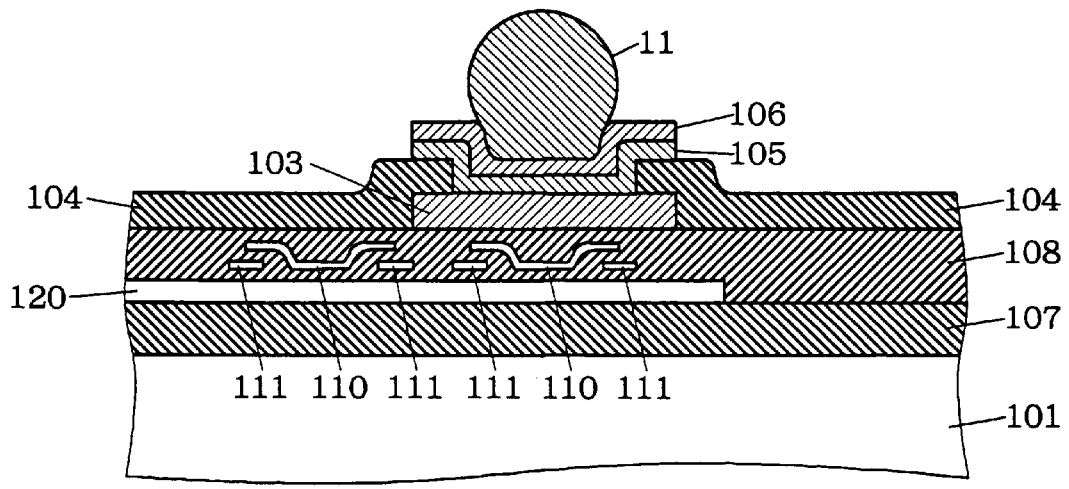
FIG. 2 is a cross-sectional view illustrating another structure of the first preferred embodiment.

FIG. 2 is a cross-sectional view illustrating another structure of the semiconductor device according to the first preferred embodiment of the present invention. The semiconductor layer 120 extends perpendicularly to the direction of a channel length not shown (that is, in the direction of a channel width). FS gates 111 are provided for FS isolation (Field Shield isolation) of a plurality of transistors arranged in the direction of the channel width. The semiconductor layer 120, even if elongated in this manner, is much thinner than the semiconductor substrate 101. Therefore, stresses are prone to be relieved and few cracks are generated in the semiconductor layer 120. Cracks, if any, in the semiconductor substrate 101 exert no influences upon the characteristics of the transistor formed in the semiconductor layer 120. Thus, the structure of FIG. 2 including the elongated semiconductor layer 120 for FS isolation does not impair the effects of the present invention, as compared with the structure of FIG. 1.

Second Preferred Embodiment

Figure 3:
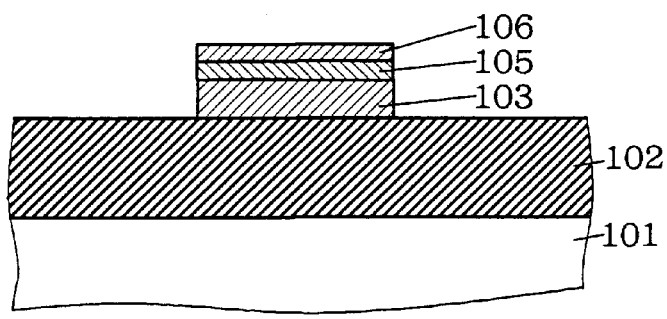
FIGS. 3 through 5 are cross-sectional view showing a method of fabricating the semiconductor device in the order of sequential process steps according to a second preferred embodiment of the present invention.
Figure 4:
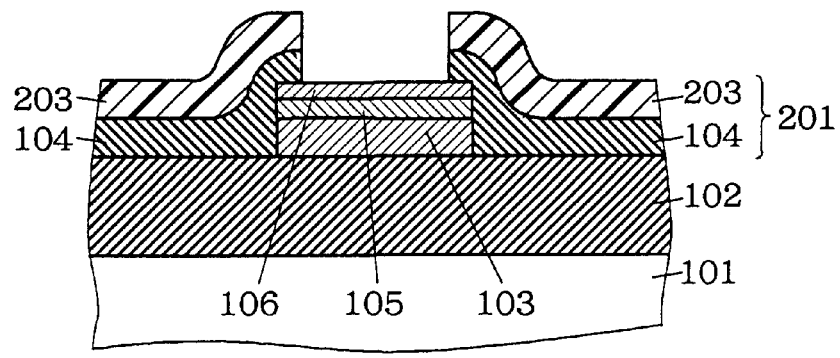
Figure 5:
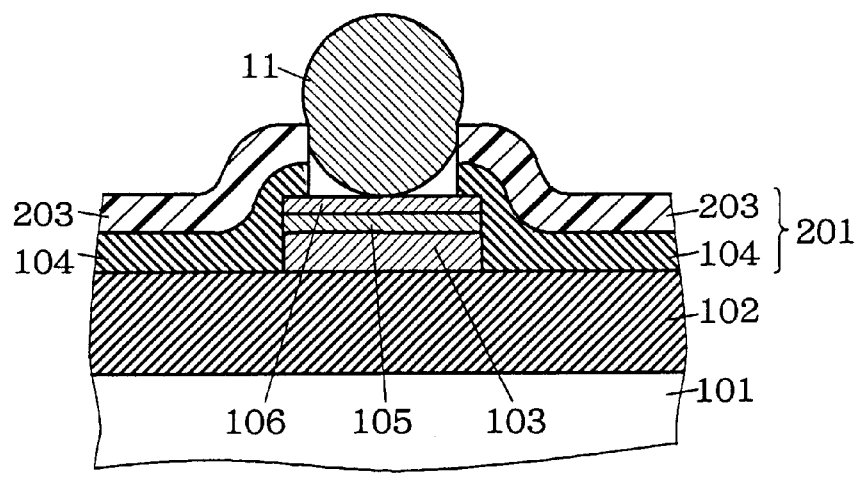

FIGS. 3 through 5 are cross-sectional views showing a method of fabricating the semiconductor device in the order of sequential process steps according to a second preferred embodiment of the present invention.

Referring to FIG. 3, an interlayer insulation film 102 is formed on the semiconductor substrate 101, and a multilayer structure consisting of the aluminum pad 103, the layer of titanium 105, and the layer of nickel 106 is formed on the interlayer insulation film 102. The aluminum pad 103 is electrically connected to source and drain regions not shown. The local triple metal layer structure as shown in FIG. 3 may be accomplished by the semiconductor fabrication techniques known in the art.

Thereafter, the silicon nitride film 104 and a polyimide layer 203 are deposited, and an opening is formed therein on the top of the layer of nickel 106 (FIG. 4). A multilayer film 201 comprised of the silicon nitride film 104 and the polyimide layer 203 serves as a film for blocking alpha rays. Further, the solder bump 11 is formed in the opening. Then, the semiconductor device in chip form is provided (FIG. 5). This structure comprising the polyimide layer 203 for preventing the alpha rays from entering the semiconductor substrate 101 may avoid errors resulting from the alpha rays if a bulk transistor is formed in the semiconductor substrate 101. Alpha rays coming from below the semiconductor substrate 101 (where the interlayer insulation film 102 is not provided) do not reach the diffusion layers 101*a* and 101*b* under normal conditions and, hence, substantially need not be taken into consideration.

The polyimide layer 203 is formed after the layer of titanium 105 and the layer of nickel 106 are formed. Temperature increases up to about 200° C. in the step of providing the solder bump 11. Therefore, the background art problem of the moisture released from the polyimide layer 203 which has already been formed is avoided.

Third Preferred Embodiment

Figure 6:
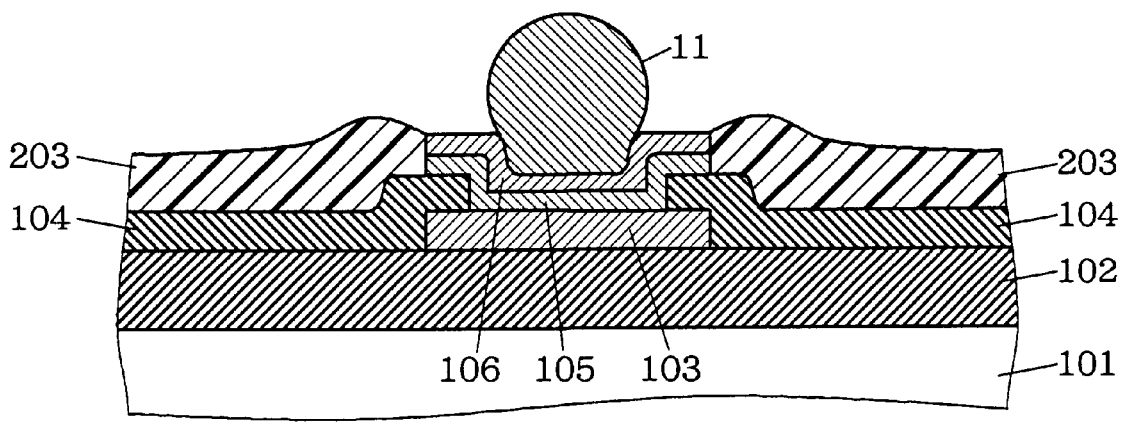
FIG. 6 is a cross-sectional view showing the method of fabricating the semiconductor device according to a third preferred embodiment of the present invention.

FIG. 6 is a cross-sectional view showing the method of fabricating the semiconductor device according to a third preferred embodiment of the present invention. Carboxylic polyamide is dropped onto the conventional structure shown in FIG. 14 except onto the solder bump 11. Thereafter, the resultant structure is heated to form the polyimide layer 203 except on the solder bump 11. This prevents alpha rays without interfering with the connection between the solder bump 11 and the printed board.

Of course, the material used in the above described technique is not limited to carboxylic polyamide, but any material that is capable of preventing alpha rays and permitted to drop down may be used.

Fourth Preferred Embodiment

Figure 7:
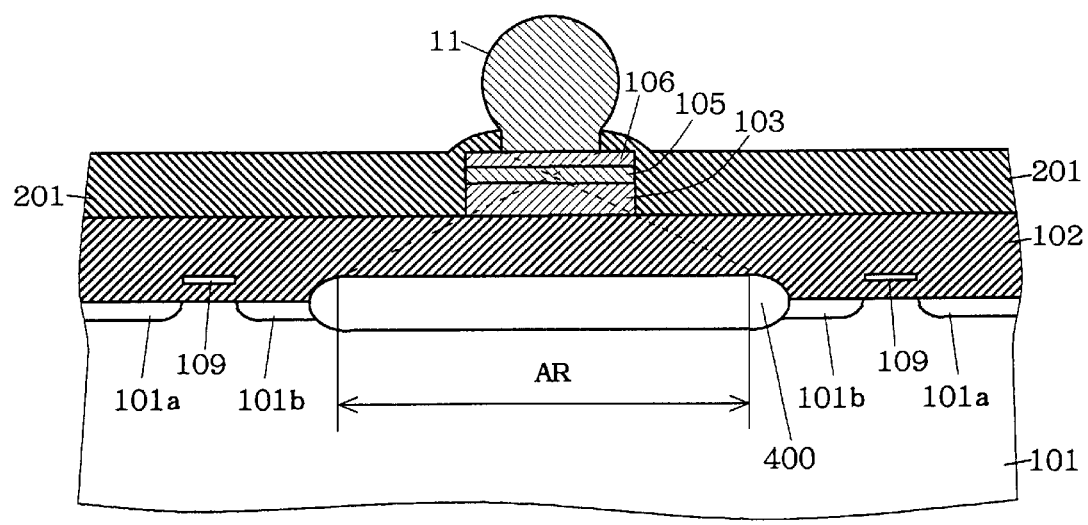
FIG. 7 is a cross-sectional view illustrating a structure of the semiconductor device according to a fourth preferred embodiment of the present invention.

FIG. 7 is a cross-sectional view illustrating a structure of the semiconductor device according to a fourth preferred embodiment of the present invention. An isolation oxide film 400 including an area AR, and diffusion layers 101*a* and 101*b* serving as source and drain regions are formed in the upper surface of the semiconductor substrate 101. The interlayer insulation film 102 surrounding gate electrodes 109 is formed on the semiconductor substrate 101. The multilayer structure comprised of the aluminum pad 103, the layer of titanium 105, and the layer of nickel 106 is locally formed on the interlayer insulation film 102. The solder bump 11 is disposed on the multilayer structure. The film 201 is formed on the interlayer insulation film 102 except on the solder bump 11. The formation of the film 201 may be achieved using the process step of forming the polyimide film 203 shown in the second or third preferred embodiment.

The presence of the film 201 and the solder bump 11 precludes an alpha ray coming through the air from entering the semiconductor substrate 101. However, since solder generally contains lead as an ingredient and radioactive isotopes as an impurity in no small amounts, there is a likelihood that an alpha ray enters the semiconductor substrate 101 from the solder bump 11 itself.

To prevent this, the area AR that is visible from the solder bump 11 without being obstructed by the film 201 is established at the upper surface of the semiconductor substrate 101. An element whose operation is influenced by a slight increase in electric charge, such as a transistor and a capacitor, is not formed in the area AR which might be entered by the alpha ray from the solder bump 11. For example, a capacitor formed in the semiconductor device employed in the CSP mounting is tens of femtocoulombs, and the operation of such a capacitor is influenced by the generation of a small number of electron-hole pairs.

The isolation oxide film 400, for example, is formed in the area AR. Alternatively, the SOI transistor highly resistant to the alpha rays which is shown in the first preferred embodiment or a resistance element may be formed in the area AR. Since the film 201 prevents the alpha ray coming from the solder bump 11 as well as the alpha ray coming through the air from reaching the transistor formed in other than the area AR, errors in the transistor due to the alpha rays are avoided.

Specifically, an element which has greater resistance to alpha rays than the element provided in other than the area AR may be formed in the area AR to allow effective area use without impairing the resistance of the entire semiconductor device to the alpha rays.

Fifth Preferred Embodiment

Figure 8:
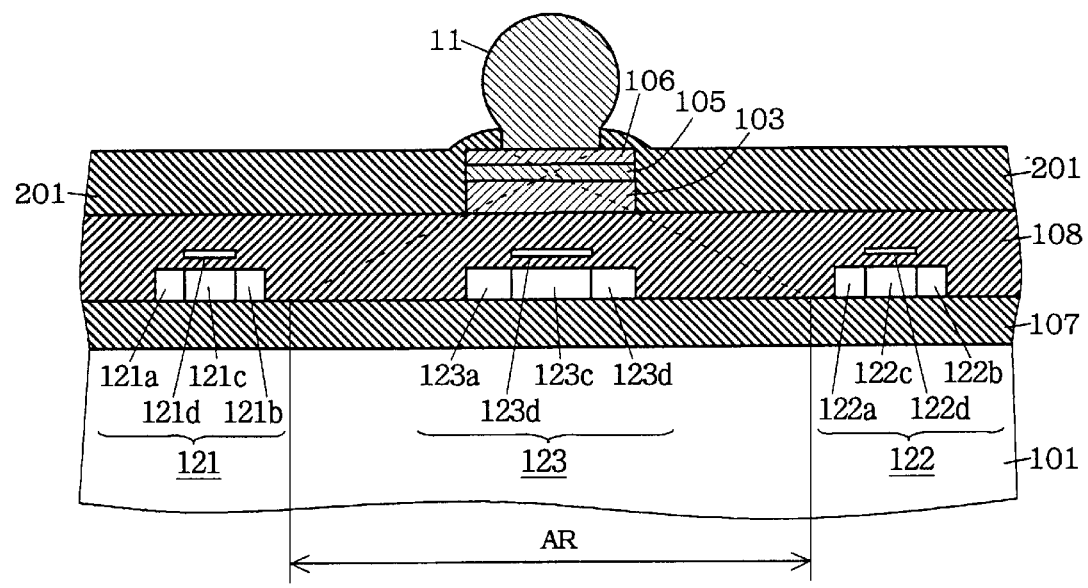
FIG. 8 is a cross-sectional view illustrating a structure of the semiconductor device according to a fifth preferred embodiment of the present invention.
Figure 9:
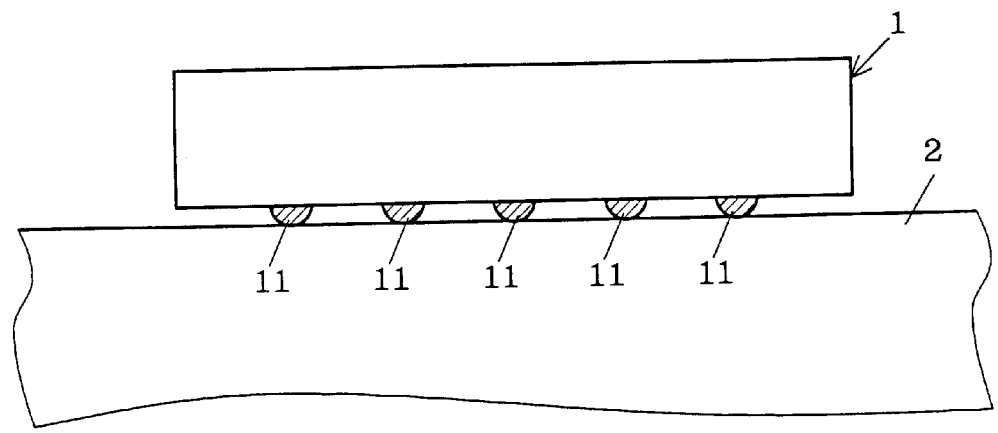
FIG. 9 is a schematic cross-sectional view showing conventional CSP mounting.
Figure 10:
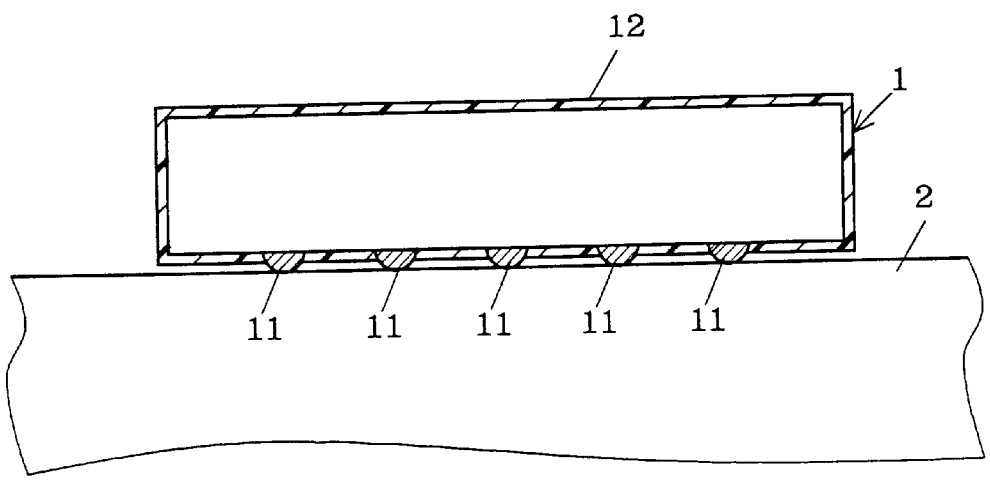
FIG. 10 is a schematic cross-sectional view showing another type of conventional CSP mounting.
Figure 11:
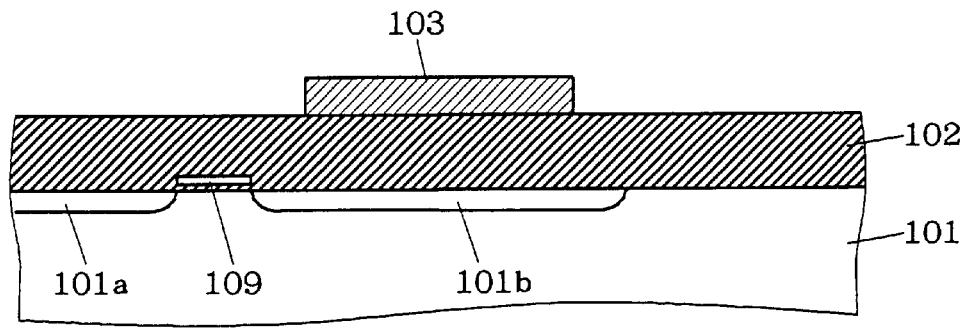
FIGS. 11 through 14 are cross-sectional views showing a method of fabricating a conventional semiconductor device in the order of sequential process steps.
Figure 12:
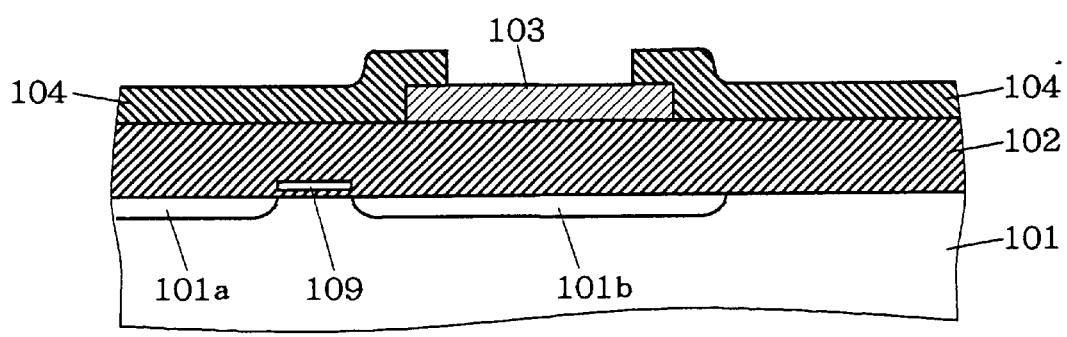
Figure 13:
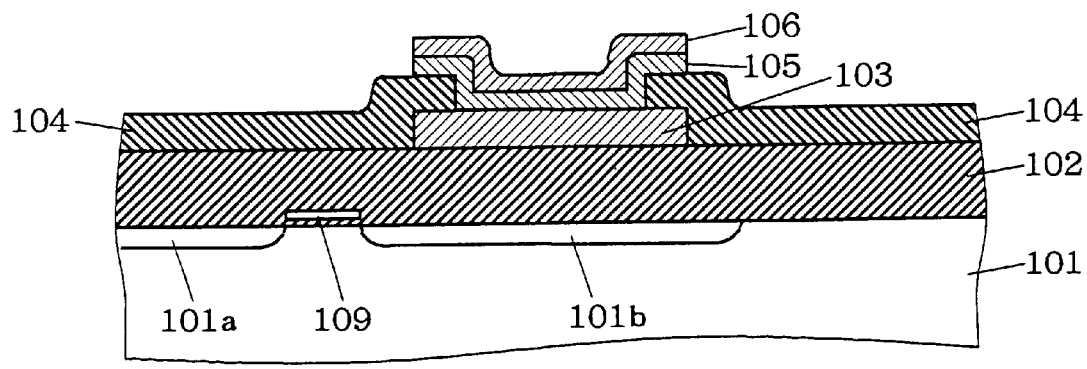
Figure 14:
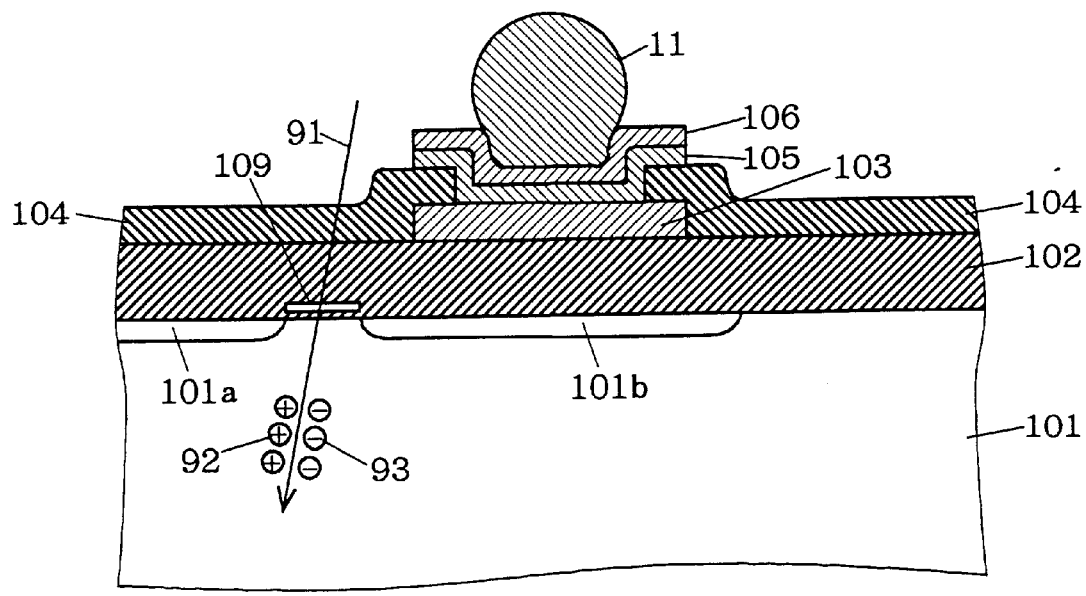

FIG. 8 is a cross-sectional view illustrating a structure of the semiconductor device according to a fifth preferred embodiment of the present invention. Like the first preferred embodiment, the semiconductor device of the fifth preferred embodiment comprises a plurality of SOI transistors 121 to 123. The SOI transistor 121 includes source and drain regions 121*a* and 121*b*, a body portion 121*c*, and a gate electrode 121*d*. The SOI transistor 122 includes source and drain regions 122*a* and 122*b*, a body portion 122*c*, and a gate electrode 122*d*. The SOI transistor 123 includes source and drain regions 123*a* and 123*b*, a body portion 123*c*, and a gate electrode 123d. The body portions 121c and 122c are floating, and the body portion 123c is at a potential fixed by the known technique not shown.

For formation of a MOS SOI transistor in the area AR, fixing the potential of the body portion of the transistor using the known technique precludes the parasitic bipolar effects of the electrons and holes generated by alpha rays and allows the effective area use while further increasing the resistance to the alpha rays.

Variation

For avoiding the generation of an alpha ray from the solder bump 11, a solder bump made of a lead-free alloy of gold and tin may be employed.

While the invention has been described in detail, the foregoing description is in all aspects illustrative and not restrictive. It is understood that numerous other modifications and variations can be devised without departing from the scope of the invention.

We claim:

1. A semiconductor device comprising:
   a semiconductor layer provided in an insulating layer and including a transistor having an SOI structure;
   an electrode provided in contact with said insulating layer and remote from said SOI structure; and
   an electrically conductive bump provided on said electrode.

2. The semiconductor device according to claim 1, wherein said electrode includes a multilayer structure comprised of a layer of titanium and a layer of nickel.

3. The semiconductor device according to claim 1, wherein said transistor is a MOS transistor.

4. The semiconductor device according to claim 1, wherein said transistor includes a plurality of transistors field-shield isolated from each other and formed in said semiconductor layer.

5. The semiconductor device according to claim 4, wherein said electrode includes a multilayer structure comprised of a layer of titanium and a layer of nickel.

6. A semiconductor device comprising:
   a semiconductor substrate;
   an electrode disposed above said semiconductor substrate;
   an electrically conductive bump provided on said electrode;
   a film covering said semiconductor substrate except said bump and configured to block an alpha ray;
   a first element disposed in said semiconductor substrate in said area that is projected from said bump without being obstructed by said film; and
   a second element disposed in said semiconductor substrate in an area other than said area, said second element being less resistant to the alpha ray than said first element.

7. The semiconductor device according to claim 6, wherein said bump is a solder bump.

8. The semiconductor device according to claim 7, wherein said electrode includes a multilayer structure comprised of a layer of titanium and a layer of nickel, and said insulating film is made of a polyimide.

9. The semiconductor device according to claim 6, wherein said first element is a MOS transistor having a body at a fixed potential.

10. The semiconductor device according to claim 9, wherein said bump is a solder bump.

11. The semiconductor device according to claim 10, wherein said electrode includes a multilayer structure comprised of a layer of titanium and a layer of nickel, and said insulating film is made of a polyimide.

12. A semiconductor device comprising:
    a semiconductor substrate;
    an electrode disposed a bove said semiconductor substrate;
    an electrically conductive bump provided on said electrode;
    a film covering said semiconductor substrate except said bump and configured to block an alpha ray;
    an isolation oxide film disposed in said semiconductor substrate in an area that is projected from said bump without being obstructed by said film; and
    an element disposed in said semiconductor substrate in other than said area.

13. The semiconductor device according to claim 12, wherein said bump is a solder bump.

14. The semiconductor device according to claim 13, wherein said electrode includes a multilayer structure comprised of a layer of titanium and a layer of nickel, and said insulating film is made of a polyimide.

15. A Chip Size Package (CSP) semiconductor device comprising:
    a semiconductor layer provided in an insulating layer and including a transistor having an SOI structure;
    an electrode provided on a surface of said insulating layer;
    an insulating film provided on said surface of said insulating layer and a surface of said electrode and having an opening exposing the top of said surface of said electrode; and
    an electrically conductive bump provided on said electrode, said bump providing CSP mounting capability for said CSP semiconductor device.

16. The semiconductor device according to claim 15, wherein said electrically conductive bump is a solder bump.

17. The semiconductor device according to claim 15, wherein said transistor is an MOS transistor.

18. The semiconductor device according to claim 15, further comprising:
    a conductive layer provided between said electrically conductive bump and said surface of said electrode which is exposed by said opening of said insulating film.

19. The semiconductor device according to claim 18, wherein said conductive layer includes a multilayer structure of metal.

20. A semiconductor device comprising:
    a semiconductor layer provided in an insulating layer and including a transistor having an SOI structure;
    an electrode provided on a surface of said insulating layer;
    an insulating film provided on said surface of said insulating layer and a surface of said electrode and having an opening exposing the top of said surface of said electrode;
    an electrically conductive bump provided on said electrode; and a printed board facing said semiconductor layer including said transistor having said SOI structure and directly connected to said electrically conductive bump.

21. The semiconductor device according to claim 20, wherein said electrically conductive bump is a solder bump.

22. The semiconductor device according to claim 20, wherein said transistor is a MOS transistor.

23. The semiconductor device according to claim 20, further comprising:

a conductive layer provided between said electrically conductive bump and said surface of said electrode which is exposed by said opening of said insulating film.

24. The semiconductor device according to claim 23, wherein said conductive layer includes a multilayer structure of metal.

* * * * *